US008154709B2

(12) United States Patent
Alberti et al.

(10) Patent No.: US 8,154,709 B2
(45) Date of Patent: Apr. 10, 2012

(54) METHOD OF PLACING A SUBSTRATE, METHOD OF TRANSFERRING A SUBSTRATE, SUPPORT SYSTEM AND LITHOGRAPHIC PROJECTION APPARATUS

(75) Inventors: Jozef Augustinus Maria Alberti, Nederweert (NL); Gerardus Petrus Matthijs Van Nunen, Berghem (NL); Frans Erik Groensmit, Helmond (NL); Rene Theodorus Petrus Compen, Valkenswaard (NL); Marco Adrianus Peter Van Den Heuvel, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 4 days.

(21) Appl. No.: 12/784,763

(22) Filed: May 21, 2010

(65) Prior Publication Data

US 2010/0265488 A1    Oct. 21, 2010

Related U.S. Application Data

(63) Continuation-in-part of application No. 12/248,586, filed on Oct. 9, 2008.

(60) Provisional application No. 60/960,699, filed on Oct. 10, 2007.

(51) Int. Cl.
*G03B 27/58* (2006.01)
*G03B 27/62* (2006.01)
(52) U.S. Cl. ............................................. 355/72; 355/75
(58) Field of Classification Search .................... 355/53, 355/72–77; 378/34, 35
See application file for complete search history.

(56) References Cited

U.S. PATENT DOCUMENTS

| 6,707,528 | B1 | 3/2004 | Aoyama et al. | |
| 6,795,164 | B2 | 9/2004 | Hoogenraad et al. | |
| 6,860,533 | B2* | 3/2005 | Lee et al. | 294/185 |
| 7,110,085 | B2 | 9/2006 | Zaal et al. | |
| 7,139,638 | B2* | 11/2006 | Nakajima et al. | 700/218 |
| 7,374,957 | B2 | 5/2008 | Oesterholt | |
| 7,564,536 | B2* | 7/2009 | Ottens et al. | 355/72 |
| 7,583,357 | B2 | 9/2009 | Donders et al. | |
| 7,706,907 | B2 | 4/2010 | Hiroki | |
| 2006/0010710 | A1* | 1/2006 | Park et al. | 34/423 |
| 2009/0153816 | A1 | 6/2009 | Alberti et al. | |

(Continued)

FOREIGN PATENT DOCUMENTS

CN        1550912 A      12/2004

(Continued)

OTHER PUBLICATIONS

Office Action mailed on Jan. 25, 2011 for U.S. Appl. No. 12/248,284, filed Oct. 9, 2008; 7 pages.

(Continued)

*Primary Examiner* — Hung Henry Nguyen
(74) *Attorney, Agent, or Firm* — Sterne, Kessler, Goldstien & Fox P.L.L.C.

(57) ABSTRACT

A method of placing a substrate onto a surface of a substrate holder, in which the surface is provided with a plurality of burls. Substrate placement data for allowing placement of the substrate at a certain position with respect to a position of the plurality of burls on the surface of the substrate holder is calculated. The substrate is placed at the certain position in accordance with the substrate placement data. The certain position may be based on the position at which placement would result in a minimized overlay error or may be based on the position at which placement would result in minimized substrate deformation.

29 Claims, 13 Drawing Sheets

U.S. PATENT DOCUMENTS

Figure 1:
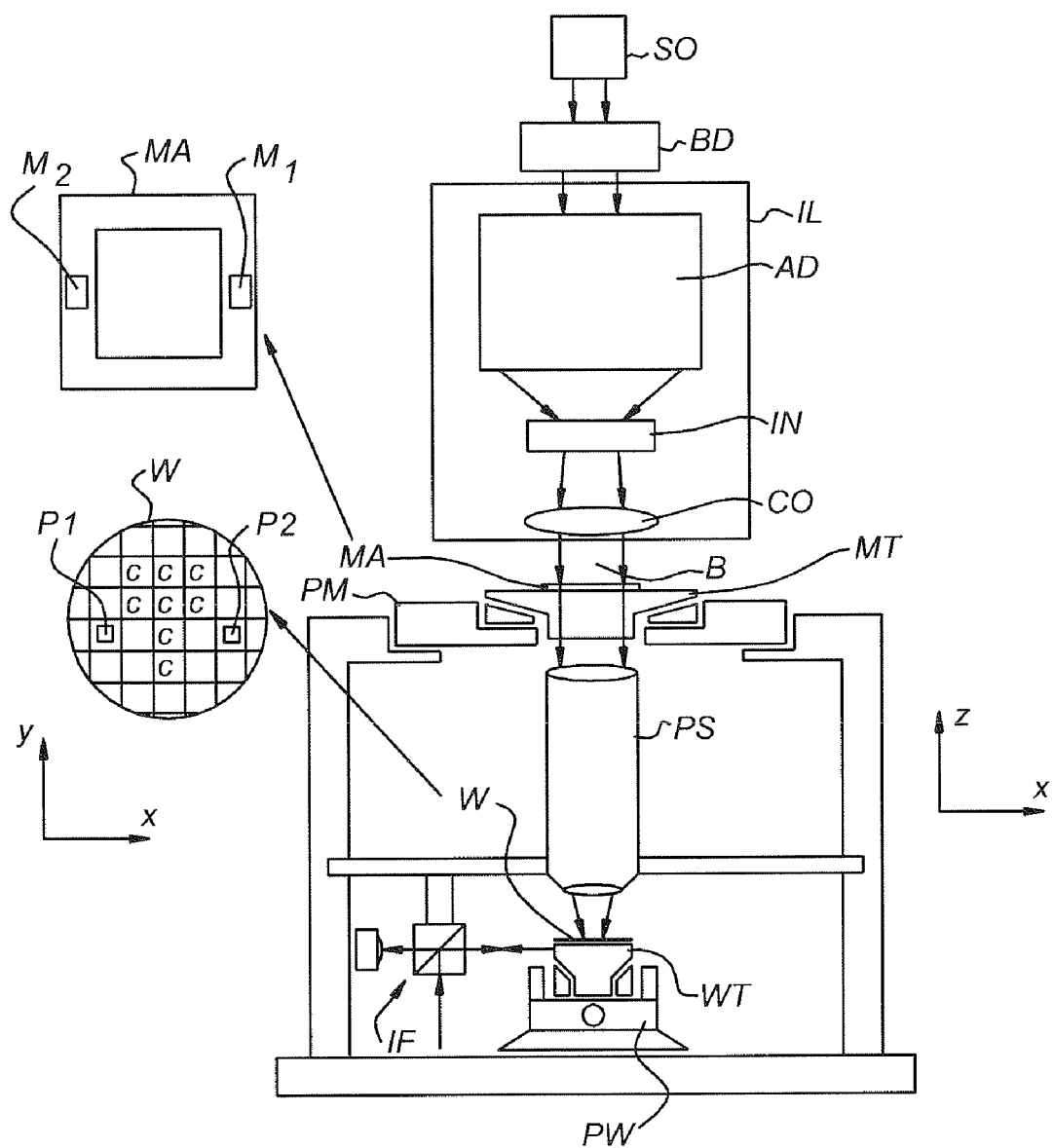

2009/0180095 A1     7/2009     Alberti et al.

FOREIGN PATENT DOCUMENTS

| | | |
|---|---|---|
| JP | 11-330206 A | 11/1999 |
| JP | 2001-127144 A | 5/2001 |
| JP | 2003-152053 A | 5/2003 |
| JP | 2003-168719 A | 6/2003 |
| JP | 2006-140498 A | 6/2006 |
| JP | 2007-027718 A | 2/2007 |

OTHER PUBLICATIONS

Office Action mailed on Jan. 25, 2011 for U.S. Appl. No. 12/248,586, filed Oct. 9, 2008; 12 pages.

Notice of Allowance mailed on Apr. 14, 2011, directed to co-pending U.S. Appl. No. 12/248,284, filed Oct. 9, 2008; 7 pages.

English language Abstract of Japanese Patent Publication No. 11-330206 A, published Nov. 30, 1999; 1 page.

English language Abstract of Japanese Patent Publication No. 2001-127144 A, published May 11, 2001; 1 page.

English language Abstract of Japanese Patent Publication No. 2003-152053 A, published May 23, 2003; 1 page.

English language Abstract of Japanese Patent Publication No. 2003-168719 A, published Jun. 13, 2003; 1 page.

English language Abstract of Japanese Patent Publication No. 2006-140498 A, published Jun. 1, 2006; 1 page.

English language Abstract of Japanese Patent Publication No. 2007-027718 A, published Feb. 1, 2007; 1 page.

English translation of Japanese Notice of Reasons for Rejection directed to related Japanese Application No. 2008-262677, the Japanese Patent Office, mailed May 30, 2011; 3 pages.

English translation of Japanese Notice of Reasons for Rejection directed to related Japanese Application No. 2008-264460, the Japanese Patent Office, mailed May 30, 2011; 4 pages.

English Language Abstract for CN 1550912 A, published Dec. 1, 2004, 1 page.

English Language Translation of Chinese Office Action issued on Oct. 12, 2010, directed to related CN Application No. 200810191102.0 from State Intellectual Property Office of People's Republic of China, Beijing, China; 2 pages.

Final Office Action directed to co-pending U.S. Appl. No. 12/248,586, filed Oct. 9, 2008, mailed Jul. 11, 2011; 16 pages.

Notice of Allowance directed to co-pending U.S. Appl. No. 12/248,284, filed Oct. 9, 2008, mailed Jul. 21, 2011; 9 pages.

\* cited by examiner

METHOD OF PLACING A SUBSTRATE, METHOD OF TRANSFERRING A SUBSTRATE, SUPPORT SYSTEM AND LITHOGRAPHIC PROJECTION APPARATUS

CROSS REFERENCE TO RELATED APPLICATIONS

This application is a continuation-in-part of U.S. application Ser. No. 12/248,586, filed Oct. 9, 2008, which claims the benefit under 35 U.S.C. §119(e) to U.S. Provisional Application No. 60/960,699, filed Oct. 10, 2007, which are both incorporated by reference herein in their entireties.

BACKGROUND

1. Field of the Invention

The present invention relates to a method of placing a substrate onto a surface of a substrate holder and a computer readable medium comprising computer executable code, which, when loaded on a computer assembly, enables the computer assembly to control such a method. The invention further relates to a method of transferring a substrate from a first substrate holder to a second substrate holder by means of a transfer unit on the basis of transfer data available thereto, as well as to a computer readable medium comprising computer executable code, which, when loaded on a computer assembly, enables the computer assembly to control such a method. The invention further relates to a support system for supporting a substrate, a lithographic apparatus comprising such a support system, a device manufacturing method using such a lithographic apparatus, and a computer readable medium comprising computer executable code, which, when loaded on a computer assembly, enables the computer assembly to control such a device manufacturing method.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In device manufacturing methods using lithographic apparatus, an important factor in the yield, i.e., the percentage of correctly manufactured devices, is the accuracy within which layers are printed in relation to layers that have previously been formed. This is known as overlay and the overlay error budget will often be 10 nm or less. To achieve such accuracy, the substrate should be aligned to the mask pattern to be transferred with great accuracy.

In order to achieve good image definition and layer overlay the irradiated surface of a substrate should be positioned accurately on supporting surface, i.e., a substrate holder, and be kept on the substrate holder as flat and as stationary as possible during exposure. Generally, for this purpose, the substrate holder is provided with a plate comprising a plurality of protrusions, also referred to as burls. On such a substrate holder, a substrate can be placed so that its backside is in contact with the burls, all of which lie in a well-defined plane. By connecting aperture(s) in the substrate holder to a vacuum generating device, the backside of the substrate can be clamped securely against the burls. The use of burls in this manner ensures that only a fraction of the area of the backside is actually pressed against a solid surface; in this way, the distorting effect of any particulate contamination on the backside of the wafer is minimized, since such contamination will most probably be situated in the empty spaces between burls rather than being pressed against the top surface of a burl.

However, if the substrate is fixed to the substrate holder as described above, the substrate will bend over the burls. As a result, an image being exposed on the substrate will shift locally. When the substrate after development is again positioned on the substrate holder for a second exposure, due to a different position with respect to protrusions, the local image shift will be different during the second exposure than during the first exposure. Consequently, an overlay error has been introduced.

With the continual desire to image ever smaller patterns to create device with higher component densities, there is pressure to reduce overlay errors, which leads to a desire for improved placement of a substrate on a substrate holder provided with burls.

SUMMARY

It may be useful to provide a method of placing a substrate, a method of transferring a substrate and a transfer system with an improved placement accuracy than hitherto known. To that end, embodiments in accordance with the invention provide methods of placing a substrate onto a surface of a substrate holder, the surface being provided with a plurality of burls, the method including acquiring a position of the plurality of burls, determining substrate placement data for enabling placement of the substrate at a certain position with respect to a position of the plurality of burls on the surface of the substrate holder, and placing the substrate at the certain position in accordance with the substrate placement data.

In an embodiment, the invention provides a computer readable medium comprising computer executable code, which, when loaded on a computer assembly, enables the computer assembly to control a method as described above.

Additionally, in an embodiment, the invention provides a method of transferring a substrate from a first substrate holder to a second substrate holder by means of a transfer unit on the basis of transfer data available thereto, the second substrate holder comprising a surface provided with a plurality of burls, the method including providing the substrate on the first substrate holder, transferring the substrate by means of the transfer unit in accordance with the transfer data from the first substrate holder to a certain position with respect to the plurality of burls on the second substrate holder, and placing the substrate at the certain position on the second substrate holder, wherein the placing is performed according to the method of placing a substrate onto a surface of a substrate holder as described above. In an embodiment the method comprises acquiring a position the plurality of burls on the substrate holders.

In an embodiment, the invention provides a computer readable medium comprising computer executable code, which, when loaded on a computer assembly, enables the computer assembly to control a method of transferring as described above.

Additionally, in an embodiment, the invention provides a support system for supporting a substrate, the support system including a substrate holder configured to hold the substrate, the substrate holder comprising a surface provided with a plurality of burls, a substrate handling device configured to place a substrate on the substrate holder in accordance with substrate placement data, a measurement unit configured to perform measurement useable for determining a position of the plurality of burls provided on the surface of the substrate holder, a processor configured to determine substrate placement data, the substrate placement data enabling placement of the substrate on the surface of the substrate holder at a certain position with respect to the position of the plurality of burls.

Additionally, in an embodiment, the invention provides a lithographic projection apparatus including an illumination system configured to provide a beam of radiation, a support structure configured to support a patterning device that serves to impart the beam of radiation with a pattern in its cross-section, a support system for supporting a substrate as described above, and a projection system configured to expose the patterned beam on the substrate.

In an embodiment, the invention provides a device manufacturing method comprising projecting a patterned beam of radiation onto a substrate using a lithographic projection apparatus as described above.

Finally, in an embodiment, the invention provides a computer readable medium comprising computer executable code, which, when loaded on a computer assembly, enables the computer assembly to control a device manufacturing method as described above.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

FIG. 1 depicts a lithographic apparatus according to an embodiment of the invention.

Figure 2A:
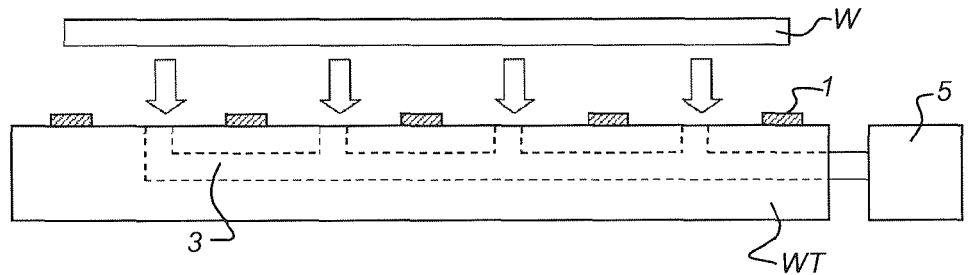
Figure 2B:
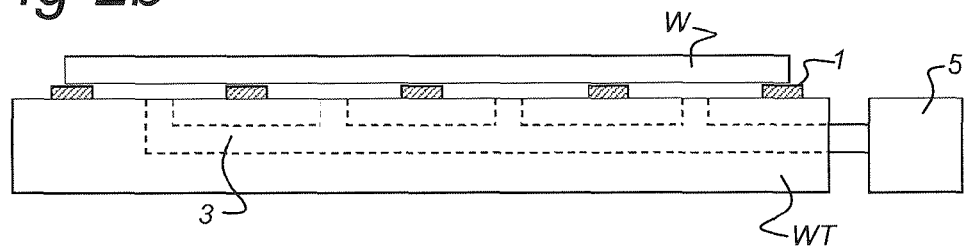
Figure 2C:
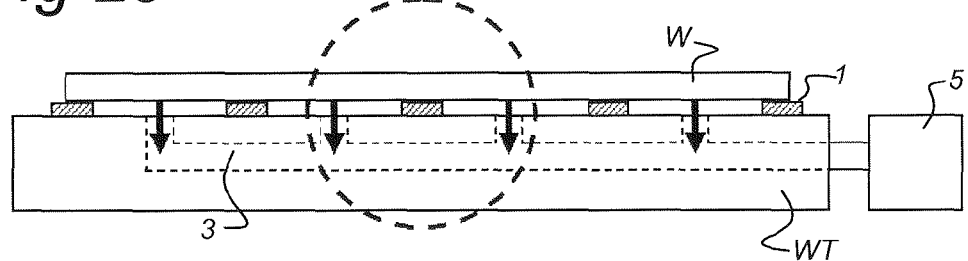

FIGS. 2a, 2b, and 2c schematically depict placement of a substrate on a substrate holder as known in the art.

Figure 2D:
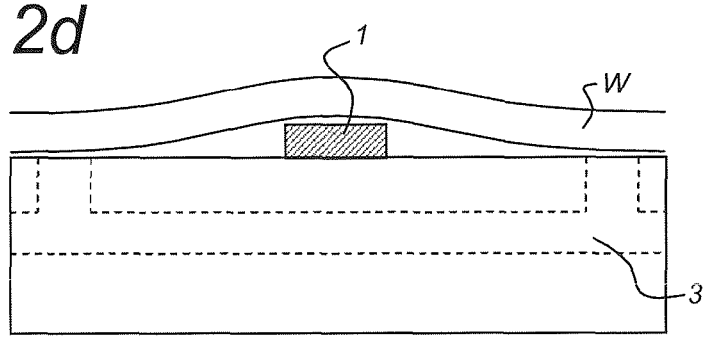

FIG. 2d schematically depicts a detail of a substrate placed on a substrate holder as shown in FIG. 2c.

Figure 3:
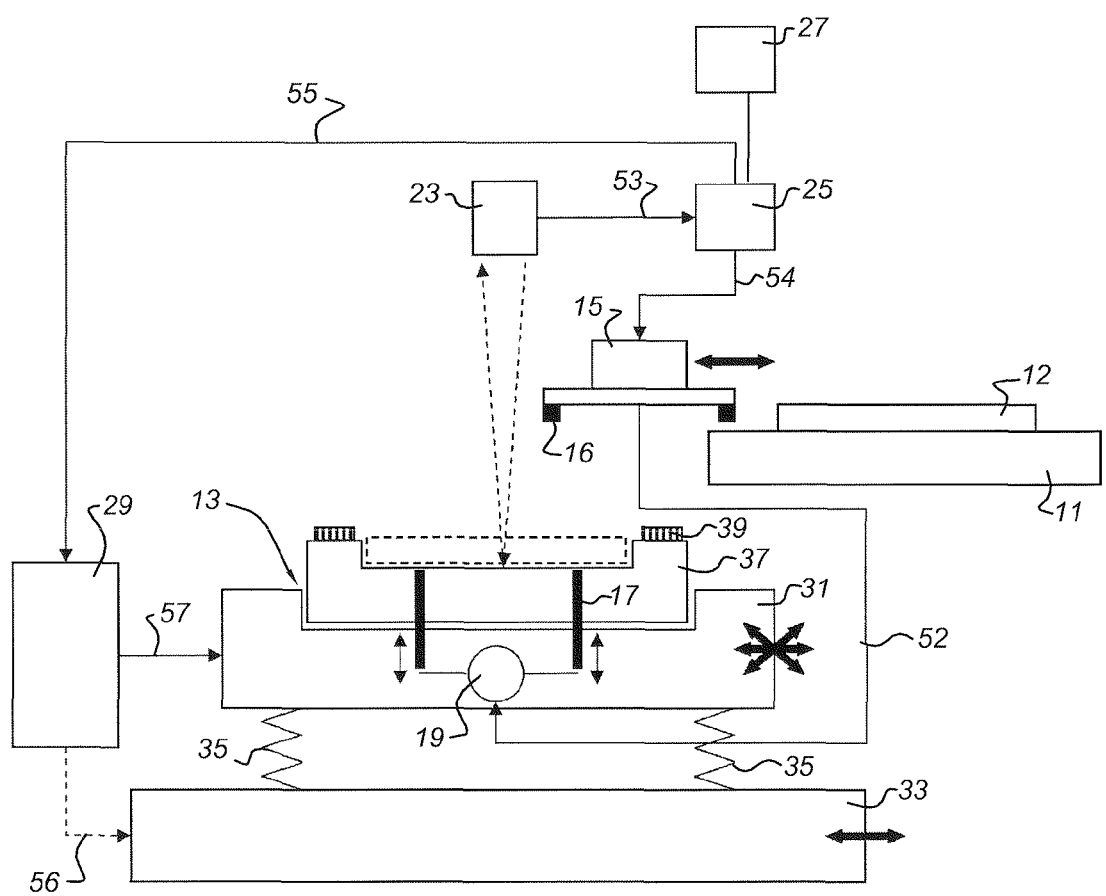

FIG. 3 schematically depicts a transfer system that may be used in embodiments of the invention.

Figure 4:
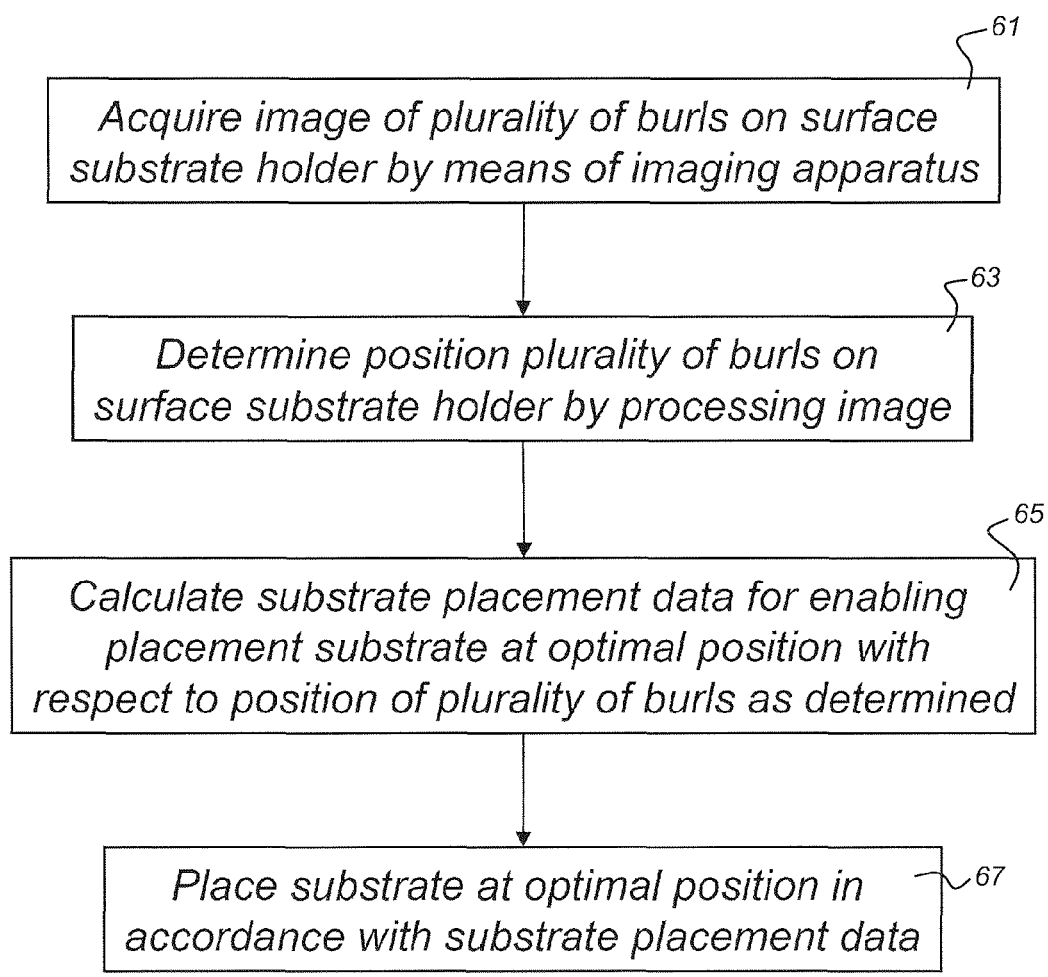

FIG. 4 schematically depicts a flow chart of a method of placing a substrate onto a surface of a substrate holder according to a first embodiment of the invention.

Figure 5:
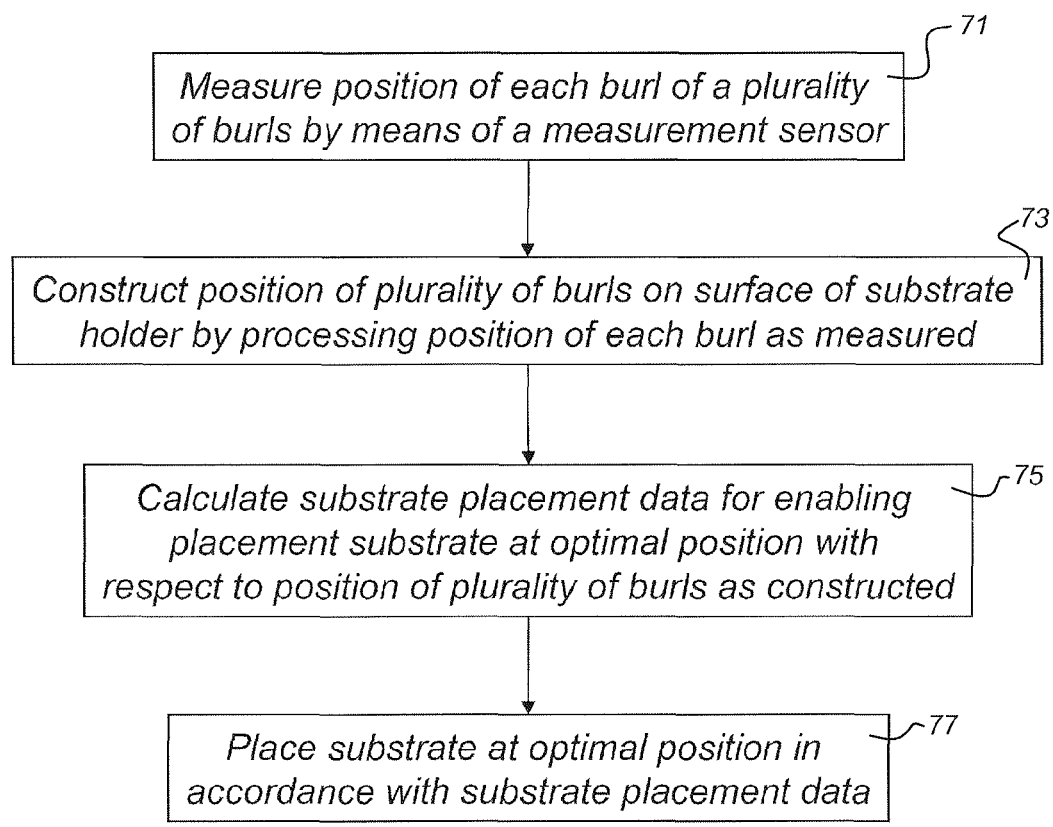

FIG. 5 schematically depicts a flow chart of a method of placing a substrate onto a surface of a substrate holder according to a second embodiment of the invention.

Figure 6:
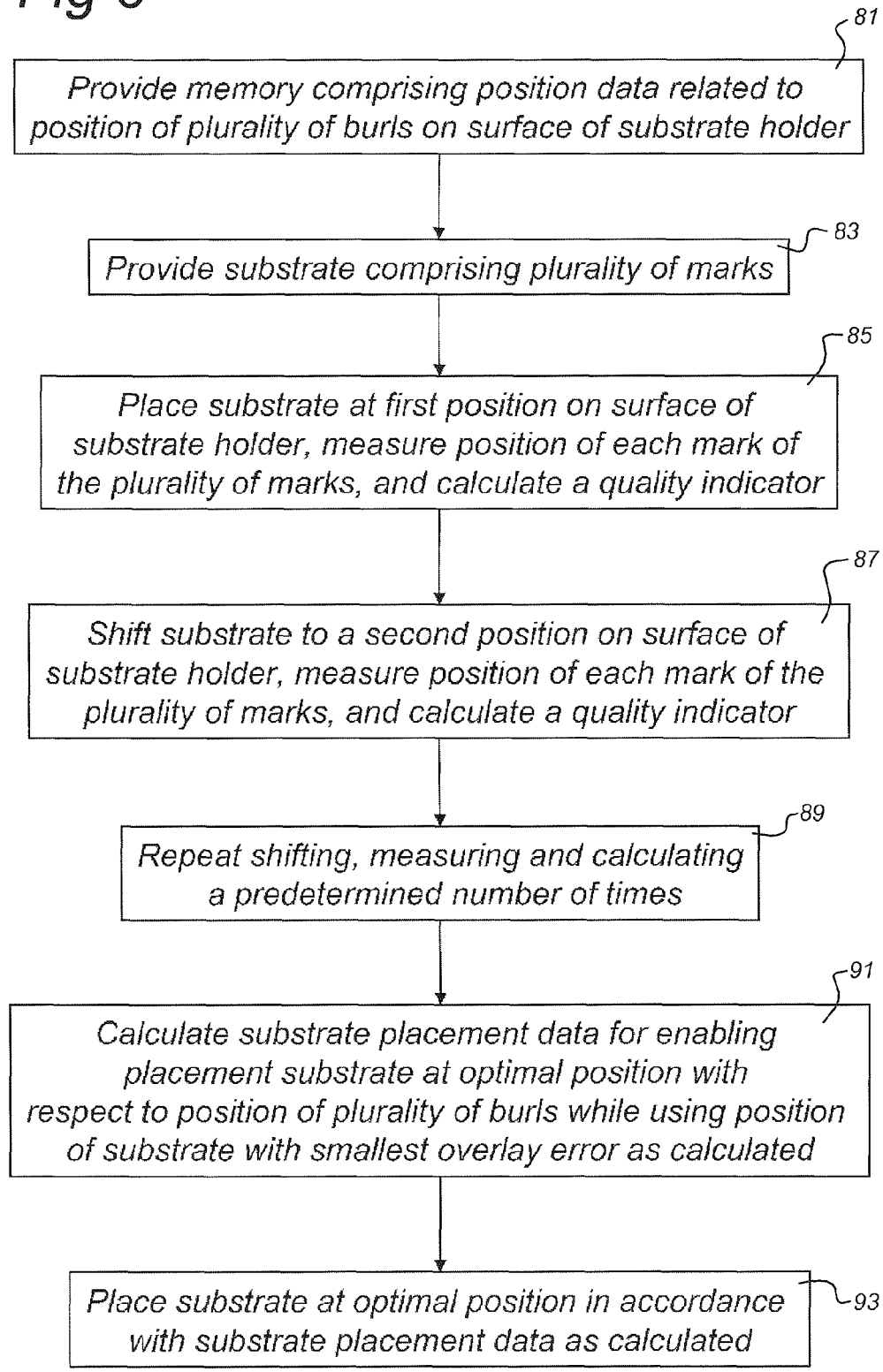

FIG. 6 schematically depicts a flow chart of a method of placing a substrate onto a surface of a substrate holder according to a third embodiment of the invention.

Figure 7A:
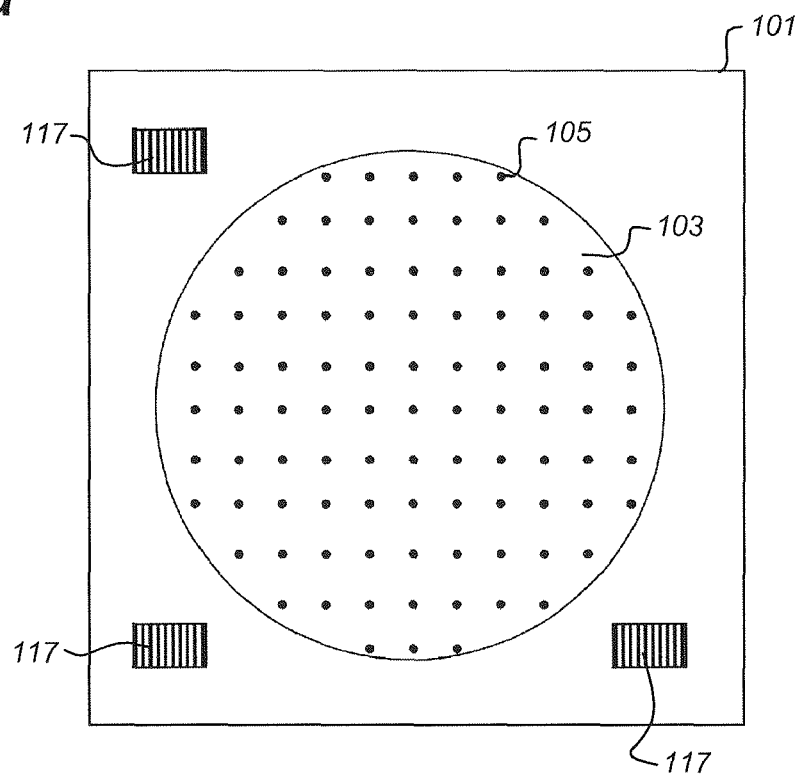

FIG. 7a schematically depicts a top view of a substrate holder comprising a surface provided with a plurality of burls.

Figure 7B:
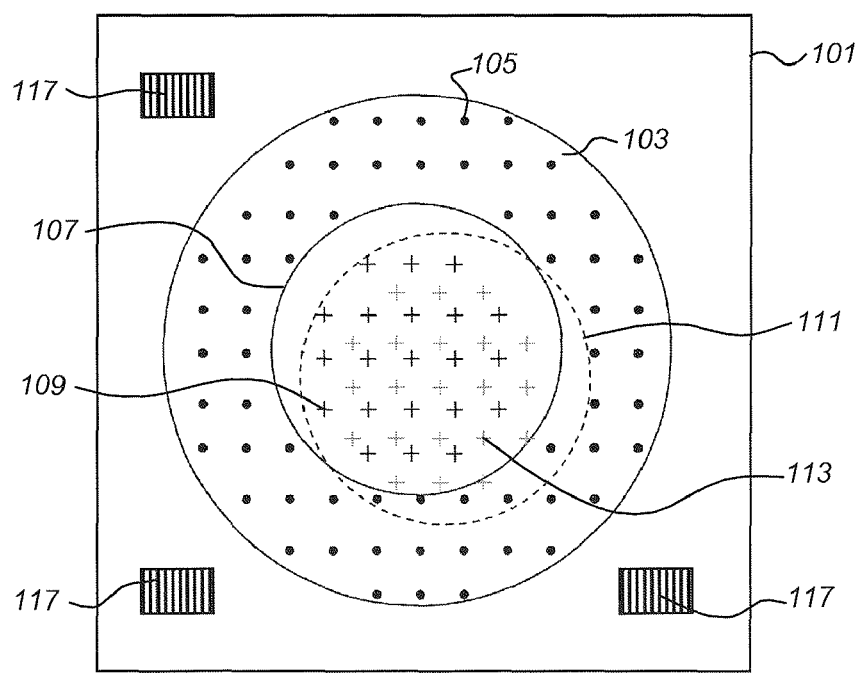

FIG. 7b schematically depicts a top view of the substrate holder of FIG. 7a on top of which a substrate is placed.

Figure 8:
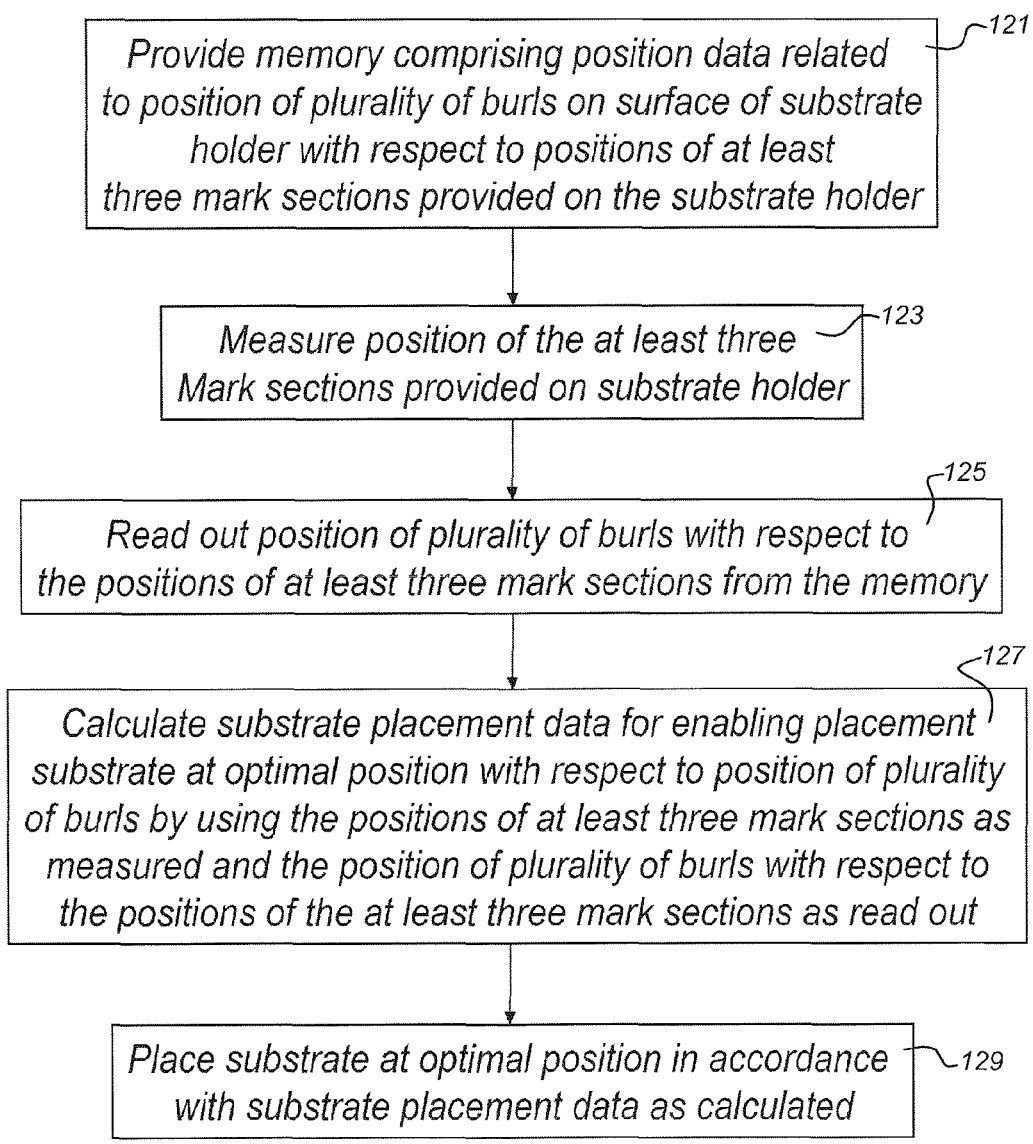

FIG. 8 schematically depicts a flow chart of a method of placing a substrate onto a surface of a substrate holder according to a fourth embodiment of the invention.

Figure 9:
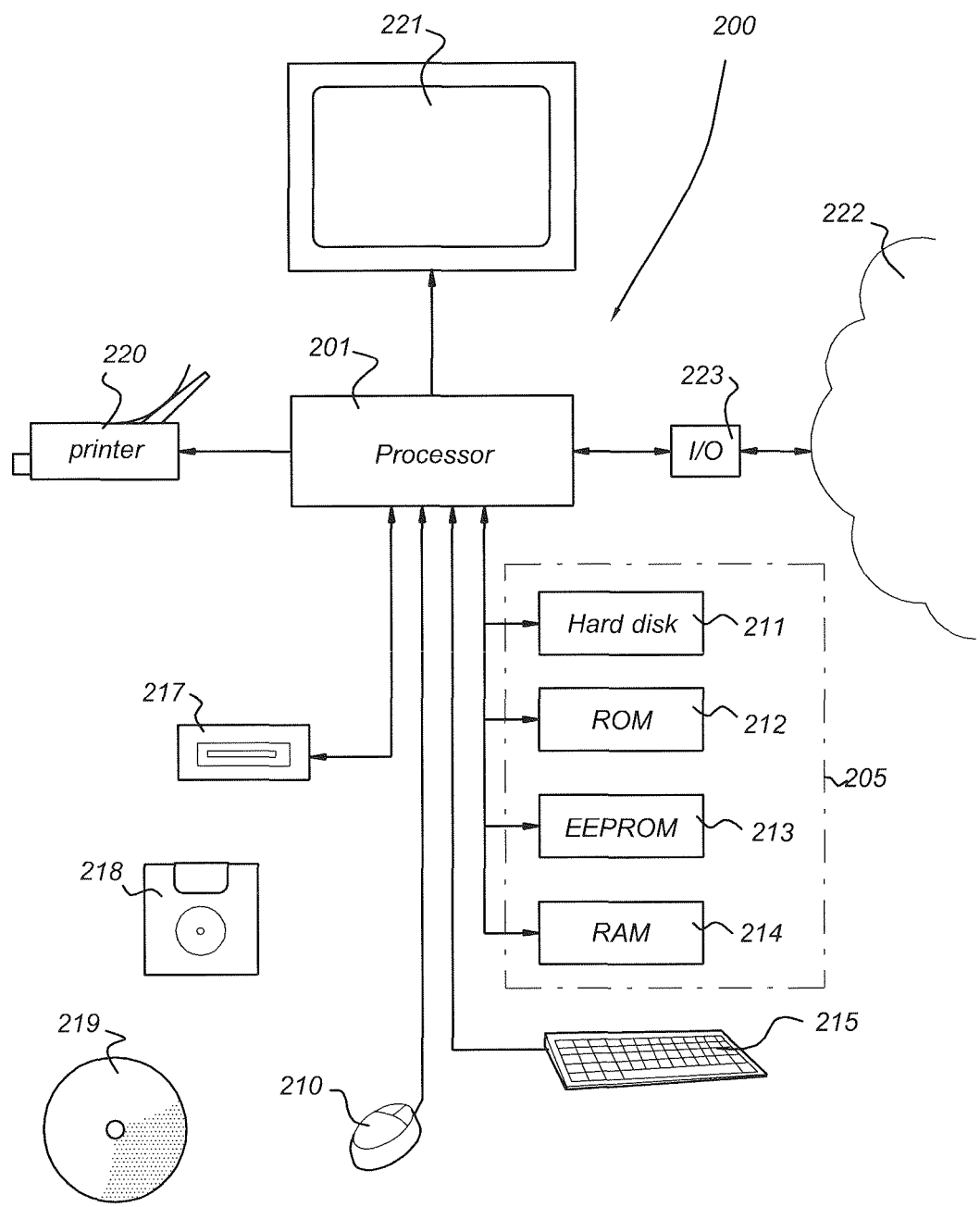

FIG. 9 schematically depicts an embodiment of a computer assembly that may be used in embodiments of the present invention.

Figure 10:
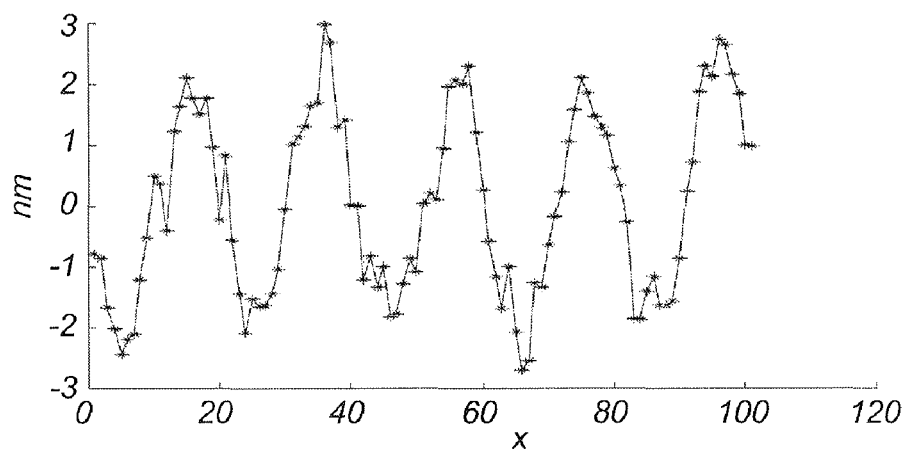

FIG. 10 schematically depicts a height measurement data of a wafer positioned on a substrate table.

Figure 11:
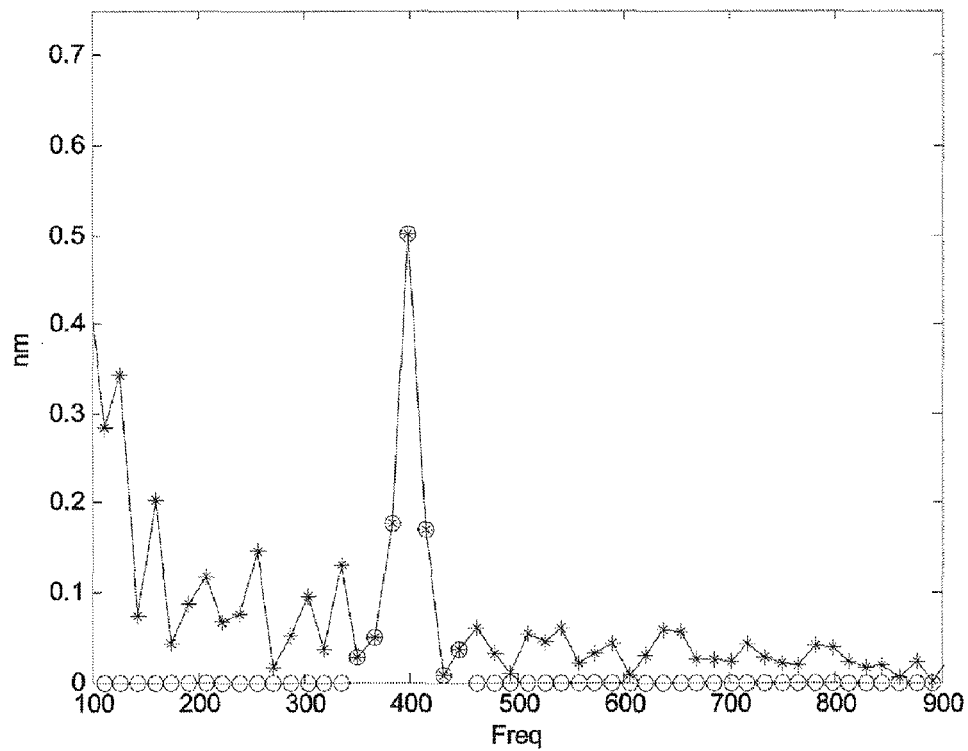

FIG. 11 schematically depicts a discrete Fourier transform of height measurement data similar to that depicted in FIG. 10.

Figure 12:
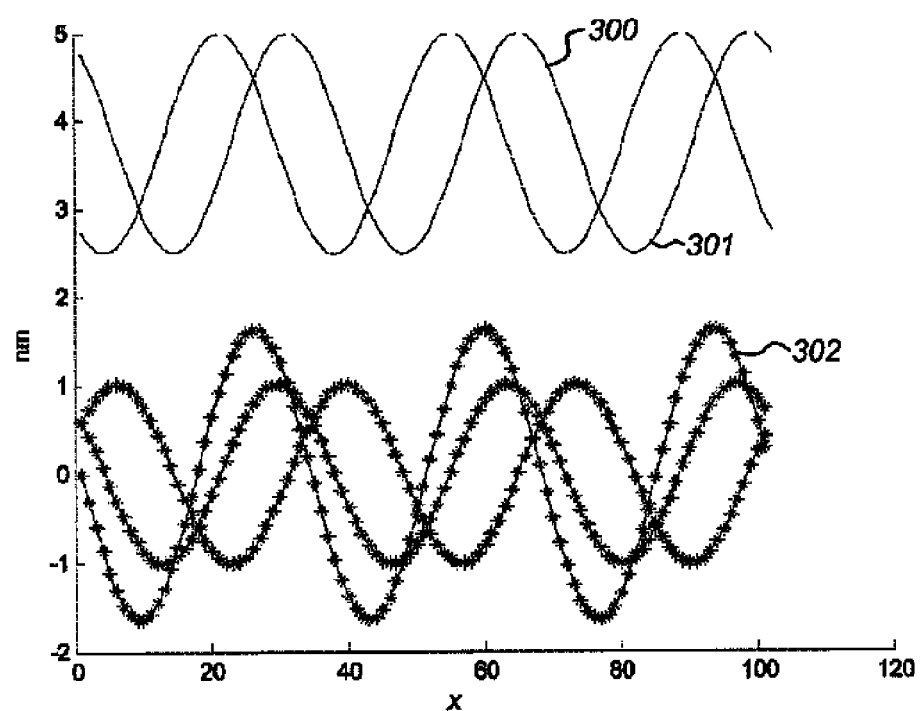

FIG. 12 depicts a simulated overlay error of an embodiment for determining the position of the burls.

FIGS. 13, 14, 15, 16a, 16b, and 17 shows various configurations of a wafer table, according to various embodiments of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

FIG. 1 schematically depicts a lithographic apparatus according to one embodiment of the invention. The apparatus comprises an illumination system (illuminator) IL configured to condition a radiation beam B (e.g., UV radiation or EUV-radiation), a support structure (e.g., a mask table) MT constructed to support a patterning device (e.g., a mask) MA and connected to a first positioner PM configured to accurately position the patterning device in accordance with certain parameters, a substrate holder, e.g., a substrate table (e.g., a wafer table) WT, constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if desirable or required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desirable or required after each movement of the substrate table WT or in between successive radiation pulses during a scan. This mode of operation can be readily applied to mask-less lithography that utilizes programmable patterning device, such as a programmable mirror array of a type as referred to above.

Combinations and/or variations on the above described modes of use or entirely different modes of use may also be employed.

FIGS. 2a-2c schematically depict placement of a substrate on a substrate holder like substrate table WT as known in the art. The substrate table WT is provided with a plurality of protrusions 1, also referred to as pimples or burls. In this document, the expression burl will be primarily used, but the two should be understood to be interchangeable herein. Generally at the edge of the wafer there is a so-called vacuum seal. In lithographic apparatus employing EUV, there will generally be electric static clamping. Many embodiments of the invention are not limited to vacuum systems, but are also applicable on electrostatic clamps.

As is shown in FIG. 2a, the substrate W is moved towards the substrate table WT until the substrate makes contact with the plurality of burls provided on the surface of the substrate table WT.

The substrate W now rests on the substrate table WT, its backside being in contact with the plurality of burls 1 on the surface of the substrate table WT, a situation which is schematically depicted in FIG. 2b.

At this stage, air may be sucked away from spaces between the plurality of burls by connecting apertures 3 in the substrate table WT to a vacuum generating device 5. The suction of air is schematically depicted in FIG. 2c by the arrows.

FIG. 2d schematically depicts a detail, i.e., shown in the dashed circle of FIG. 2c, of a substrate W placed on a substrate table WT. Due to the vacuum between the substrate W and the substrate table WT, and the uneven surface of the substrate table WT due to the plurality of burls 1, the substrate W is locally deformed. As a result, an image being exposed on the substrate W will shift locally with respect to the desired image. When the substrate W after development is again positioned on the substrate table WT for a second exposure, due to a different position with respect to the plurality of burls 1, the local image shift will be different during the second exposure than during the first exposure. Consequently, an overlay error has been introduced.

FIG. 3 schematically depicts a transfer system that may be used in embodiments of the invention. The transfer system depicted in FIG. 3 is suitable for use in a lithographic projection apparatus. It is configured to transfer a substrate on the basis of transfer data available thereto. The transfer system comprises a first substrate holder 11, a second substrate holder 13, and a transfer unit 15.

The first substrate holder 11 is configured to hold a substrate 12. In an embodiment, the first substrate holder 11 is rotatable around its center, i.e., the center of the surface on which the substrate can be held. Therefore, an axis of rotation is substantially perpendicular to aforementioned surface.

The second substrate holder 13 is also configured to hold the substrate 12 on a surface thereof The aforementioned surface of the second substrate holder 13 is provided with a plurality of burls. A position of the plurality of burls can be acquired. In an embodiment acquiring the position of the plurality of burls comprises positions of at least four burls. Acquiring the position can comprise a calibration, in particular a relative position with respect to a fixed part, e.g., a part of the substrate table.

If the transfer system is used in a lithographic projection apparatus, the second substrate holder 13 may correspond to the substrate table WT and the substrate 12 to be held may correspond to substrate W. Furthermore, the first substrate holder 11 may correspond to a substrate table used in a pre-alignment unit.

The transfer unit 15 is configured to transfer the substrate 12 from the first substrate holder 11 to the second substrate holder 13. The transfer is executed in accordance with aforementioned transfer data. In the embodiment schematically depicted in FIG. 3, the transfer unit 15 comprises two sub-units, i.e., a gripper unit 16 configured to pick up the substrate 12 from the first substrate holder 11 and move the substrate 12 towards the second substrate holder 13, and three or more extendable pins residing in the second substrate holder 13, so-called E-pins 17. The position and movement of the E-pins 17 may be controlled by an E-pins actuator 19, e.g., a Lorentz motor, which in turn may be controlled by local electronics. As a safety measure on power failure occurrences, the E-pins 17 may be configured to fall to their lowest position by the natural force of gravity. This may ensure that the E-pins 17 are not to be damaged. The transfer unit 15 may now be arranged to control movement of the substrate 12 held by the gripper unit 16 in cooperation with movement of the E-pins 17, schematically depicted by means of arrows 51 and 52 respectively. The transfer unit 15 may control movement of the gripper unit 16 in a direction towards the E-pins 17, in FIG. 3 a movement to the left, such that the substrate 12 is positioned suitably above the E-pins 17. The transfer unit 15 may then control extension of the E-pins 17 towards the substrate 12, in FIG. 3 upwards, until they make contact with the substrate 12. The transfer unit 15 subsequently controls detachment of the substrate 12 from the gripper unit 16 and subsequent movement of the gripper unit 16 away from the E-pins 17, e.g., in FIG. 3 a movement to the right until the gripper unit 16 no longer blocks a movement of the substrate 12 towards the second substrate holder 13. Finally, the transfer unit 15 may control retraction of the E-pins 17 until the substrate 12 is positioned on the second substrate holder 13.

The transfer system further comprises a measuring unit 23, e.g., an imaging apparatus like a (CCD)-camera or the like or a measurement sensor. In case the measuring unit 23 is an imaging apparatus, the measuring unit 23 may be configured to acquire an image of the plurality of burls on the surface of the second substrate holder 13. In case the measuring unit 23 is a measurement sensor, a position of each burl of the plurality of burls on the second substrate holder 13 may be measured. Alternatively or additionally, measurement unit 23 may be configured to measure the position of marks provided on the substrate 12 or the position of marks provided on the second substrate holder 13.

The transfer system further comprises a processor 25. In embodiments of the invention, the processor 25 is configured to calculate substrate placement data for enabling placement of the substrate 12 at an optimal position with respect to the position of the plurality of burls on the second substrate holder 13. In a transfer system as shown in FIG. 3, the processor 25 is configured to transmit aforementioned substrate placement data to the transfer unit 15 in order to enable the transfer unit 15 to control placement of the substrate in accordance with the substrate placement data.

In an embodiment, the processor 25 is communicationally connected to the measurement unit 23. It then uses information received from the measuring unit 23 to calculate the substrate placement data. Additionally, the processor 25 may be in communication with a memory 27. Information stored in a memory 27 may be used by the processor 25 for the calculation of aforementioned substrate placement data. More details with respect to the functionality of the processor 25 are described with reference to FIGS. 4-6 and 8.

Movement of the second substrate holder 13 may be controlled by a control unit 29, which in its turn may be communicationally connected to the processor 25 or the transfer unit 15 in case accurate placement of the substrate in view of the substrate placement data movement of the second substrate holder 15 is desirable or required. A data stream the processor 25 and the control unit 29 is in FIG. 3 schematically depicted by arrow 55.

It should be understood that, although in FIG. 3 the processor 25, the transfer unit 15, and the control unit 29 are depicted as separate elements, the processor 25 may be incorporated in one of the transfer unit 15 and the control unit 29, e.g., in case the control unit 29 takes the form of a computer assembly as described with reference to FIG. 9.

Positioning of a substrate table WT in a lithographic projection apparatus is generally implemented by a so-called short-stroke stage module and a so-called long-stroke stage module, in FIG. 3 indicated by reference number 31 and 33 respectively. The combined positioning ability of theses two stage modules 31, 33 provides an accurate and fast positioning. The long-stroke stage module 33 generally provides coarse positioning and movement of the short-stroke stage module 31 in a number of directions, generally three. The short-stroke stage module 31 generally provides accurate movement and positioning of a substrate W placed thereon in six degrees of freedom. The short-stroke stage module 31 may be separated from the long-stroke stage module 33 by means of air bearings 35 and may be driven by one or more Lorentz motors (not shown).

The control unit 29 may comprise separate control modules to control movement and positioning of the short-stroke stage module 29 and the long-stroke stage module 33 separately. Alternatively, the same control unit 29 may be configured to control movement and positioning of both the long-stroke stage module 31 and the short-stroke stage module 33, this situation being depicted in FIG. 3 by arrows 56 and 57 respectively.

As schematically depicted in FIG. 3, the second substrate holder 13 may not only comprise a short-stroke stage module 31, but also an additional element 37. The additional element 37 may be provided with a recess area sufficiently large to accommodate the substrate 12. The surface of the recess is then provided with aforementioned plurality of burls and further provided with apertures between the plurality of burls for the purpose of establishing a vacuum environment as discussed with reference to FIGS. 2a-d. In immersion lithographic projection apparatus, the recess in the additional element 37 may also have the purpose of containing and controlling immersion fluid.

Furthermore, the second substrate holder 13 may be provided with one or more marks 39.

In embodiments of the method of placing a substrate onto a surface of a substrate holder which surface is provided with a plurality of burls, the method comprises determining substrate placement data and placing the substrate in accordance with the substrate placement data. The substrate placement data enable placement of the substrate at a certain position with respect to the position of the plurality of burls on the surface of the substrate holder, i.e., the position of the plurality of burls as a whole and the position and orientation of the plurality of burls with respect to each other. The certain position relates to an optimal position that may be determined with respect to several different criteria.

First, the optimal position may relate to an optimal position with respect to overlay, i.e., a position which results in the smallest overlay error is recognized as the optimal position. In other words, consider a situation in which a first exposure of a substrate in a lithographic apparatus has taken place at a certain position with respect to a plurality of burls arranged in a certain pattern on a surface of a substrate holder, e.g., the second substrate holder as schematically depicted in FIG. 3. Then, in case the same substrate holder is used for a subsequent, second exposure in the lithographic apparatus, the optimal position of the substrate corresponds exactly with the position the substrate had during the first exposure. However, in case a different substrate holder, i.e., a third substrate holder, for example a different substrate holder in the same lithographic apparatus or a similar substrate holder in a different lithographic apparatus, is used for a subsequent, second exposure in a lithographic apparatus, the situation may be different. In case the third substrate holder comprises a surface provided with a plurality of burls similarly arranged as in the substrate holder, e.g., the second substrate holder, used for the first exposure, the optimal position of the substrate is a position in which the substrate is positioned with respect to the plurality of burls in a similar way as during the first exposure. In case the arrangement of the plurality of burls differs per substrate holder, more difficult calculations come into play to calculate optimum positioning for best overlay results, e.g., calculations in which a prediction how substrate deformation on the particular arrangement of the plurality of burls at hand will be taken into account.

Secondly, the optimal position may relate to deformation. As described with reference to FIG. 2d, due to the creation of a vacuum in a space between the plurality of burls, the substrate is locally deformed, which results in local exposure errors if the substrate is exposed in a lithographic apparatus while being in such a condition. The optimal position may relate to a position in which the local deformations are minimized. In an embodiment, minimization of the local deformations corresponds with determining the least square or a 99.7% interval and selecting a position in which the least square is minimized or 99.7% is optimized respectively. Alternatively, it may mean that the position is selected in which the average local deformation is lowest. In another embodiment, minimization of the local deformation may mean that at positions where most critical features are to be patterned, the local deformations are smallest, which may mean that local deformations at other positions on the substrate are higher than average.

Finally, the optimal position may be predetermined, i.e., a substrate placement position is stored in a memory in a computer assembly in communication with one or more lithographic projection apparatus, also referred to as "matched machines". Each substrate to be processed one of these matched machines needs to be placed at that predetermined position on its respective substrate holder. The substrate placement data are then determined to establish aforementioned placement.

Of course, the optimal position may also relate to both overlay and deformation as both are closely related. After all, consider again the situation in which a substrate is exposed while being placed on a surface of a certain substrate holder in a lithographic apparatus, the surface being provided with a plurality of burls arranged in a certain pattern. Then, an optimal position for the substrate in a subsequent exposure, while the substrate is placed on surface of a different substrate holder in a lithographic apparatus, the surface being provided with a plurality of burls arranged in a similar pattern as before, may be different with respect to the plurality of burls as compared to the first exposure. This may be the case when the plurality of burls provided on the surface of the substrate holder used in the first exposure differs with respect to faun and/or size as compared to the plurality of burls provided on the surface of the substrate holder used in the subsequent, second exposure.

FIG. 4 schematically depicts a flow chart of a method of placing a substrate onto a surface of a substrate holder according to a first embodiment of the invention. First, in action 61, an image of a plurality of burls on a surface of a substrate holder is acquired by means of an imaging apparatus. In case a transfer system as schematically depicted in FIG. 3 is used, the plurality of burls are provided on the second substrate holder 13 and the imaging apparatus corresponds to measurement unit 23.

Subsequently, in action 63, the position of the plurality of burls on the surface of the substrate holder is determined by processing of the image. This processing is performed by a processor. In case a transfer system as schematically depicted in FIG. 3 is used, the processor corresponds to processor 25. In an embodiment, the processing of the image involves the use of a pattern recognition technique.

Then, in action 65, the substrate placement data for enabling placement of the substrate at an optimal position with respect to the position of the plurality of burls as determined is calculated by the processor.

Finally, in action 67, the substrate is placed at aforementioned optimal position in accordance with the substrate placement data as calculated.

FIG. 5 schematically depicts a flow chart of a method of placing a substrate onto a surface of a substrate holder according to a second embodiment of the invention. In this embodiment, in action 71, first, the position of each burl of a plurality of burls provided on a surface of a substrate holder is measured by means of a measurement sensor. In case a transfer system is used as schematically shown in FIG. 3, the measurement sensor corresponds with measurement unit 23 and the substrate holder corresponds with the second substrate holder 13.

Subsequently, in action 73, the position of the plurality of burls on the surface of the substrate holder by processing the position of each burl as measured. The construction by processing is performed by a processor. In case a transfer system is used as schematically depicted in FIG. 3, the processor corresponds with processor 25.

Then, in action 75, again substrate placement data are calculated for enabling placement of the substrate at an optimal position with respect to the position of the plurality of burls as constructed.

Finally, in action 77, the substrate is placed at aforementioned optimal position in accordance with the substrate placement data as calculated.

FIG. 6 schematically depicts a flow chart of a method of placing a substrate onto a surface of a substrate holder according to a third embodiment of the invention. First, in action 81, a memory is provided. The memory comprises position data related to a position of a plurality of burls on a surface of a substrate holder. In case a transfer system is used as schematically depicted in FIG. 3, the memory corresponds to memory 27.

Additionally, in action 83, a substrate is provided. The substrate comprises a plurality of marks.

Subsequently, in action 85, the substrate is placed at a first position on the surface of the substrate holder, the position of each mark of the plurality of marks is measured, and a quality indicator is calculated. The quality indicator is a numerical value representing the quality of a certain position, i.e., a measure for an overlay error or a measure for the average amount of deformation taking place at that certain position. In FIG. 7a, a top view of a substrate holder 101 comprising a surface 103 provided with a plurality of burls 105 is schematically depicted. In FIG. 7b, a top view is schematically depicted of a substrate 107, 111 comprising a plurality of marks 109, 113.

Then, in action 87, the substrate is shifted to a second position on the surface of the substrate holder. The position of each mark of the plurality of marks is measured at this second position and a quality indicator is calculated. The shifting, measuring and calculating is performed a predetermined number of times, represented by action 89. Actions 85 and 87 considering that the predetermined number of times of action 89 equals zero, is schematically depicted in FIG. 7b. The substrate 107, 111 in FIG. 7b is placed at two different positions on the substrate holder 101 of FIG. 7a. In one position, e.g., the first position, the circumference of the substrate 107 is presented in a solid form, while the substrate 111 with dashed circumference shows the substrate at another position, e.g., the second position. The plurality of marks 113 at the latter position are depicted vaguely compared to the plurality of marks 109 on the substrate 107 in the "solid-circumference" position.

Subsequently, in action 91, substrate placement data are calculated. They are calculated by the processor. The substrate placement data enable placement of the substrate at an optimal position with respect to the position of the plurality of burls. In the process of calculating the substrate placement data, the position of the substrate with the smallest overlay error as calculated is used.

Finally, in action 93, the substrate is placed at aforementioned optimal position in accordance with the substrate placement data as calculated.

FIG. 8 schematically depicts a flow chart of a method of placing a substrate onto a surface of a substrate holder according to a fourth embodiment of the invention. First, in action 121, a memory is provided. In case a transfer system is used as schematically depicted in FIG. 3, the memory corresponds to memory 27. The memory comprises position data related to the position of a plurality of burls on a surface of a substrate holder with respect to positions of at least three mark sections, provided on the substrate holder, i.e., at least three marks in case all marks provide information with respect to one direction, e.g., X-direction or Y-direction) or two marks in case one of the marks provides information with respect to one direction, e.g., X-direction or Y-direction, and a direction substantially perpendicular thereto, e.g., in case of aforementioned direction Y-direction or X-direction respectively. It should be understood that the term mark section does not necessarily relate to a section of a mark, but may also relate to other elements that may serve as some kind of reference, e.g., a reference burl which is not in contact with the substrate or some kind of seal.

With reference to FIGS. 7a and 7b, three marks 117 are provided, which three marks 117 have a known relationship with the plurality of burls 105 present on a surface 103 of the substrate holder 101.

Subsequently, in action 123, the position of the at least three mark sections that are provided on the substrate holder is measured. The measurement may be performed by any suitable measurement unit. In case a transfer system is used as schematically depicted in FIG. 3, the measurement unit corresponds with measurement unit 23. Additionally, in action 125, the position of the plurality of burls with respect to the position of the at least three mark sections on the respective substrate holder is read out from the memory. The data related to this relative position of the at least three mark sections is provided to a processor. In case a transfer system is used as schematically depicted in FIG. 3, the processor corresponds with processor 25. Furthermore measurement data obtained by the measurement unit is also provided to the processor.

Subsequently, in action 127, substrate placement data are calculated by the processor. The substrate placement data enable placement of the substrate at an optimal position with respect to the position of the plurality of burls. In the calculation performed by the processor, the positions of the at least three mark sections as measured and the position of the plurality of burls with respect to the positions of the at least three mark sections as read out are used.

Finally, in action 129, the substrate is placed at an optimal position in accordance with the substrate placement data as calculated.

FIG. 9 schematically depicts an embodiment of a computer assembly that may be used in embodiments of the present invention. Such a computer assembly 200 may be a dedicated computer in the form of a control unit, e.g., control unit 29. The computer assembly 200 may be arranged for loading a computer readable medium comprising computer executable code. This may enable the computer assembly 200 to execute, when the computer executable code on the computer readable medium is loaded, embodiments of aforementioned method of transferring a substrate from a first substrate holder to a second substrate holder by means of a transfer unit on the basis of transfer data available thereto Additionally or alternatively, this may enable the computer assembly 200 to execute, when the computer readable medium is loaded, a device manufacturing method in which a target portion of a substrate is patterned by means of embodiments of a lithographic projection apparatus comprising such a transfer system.

The computer assembly 200 comprises a processor 201, e.g., processor 25 in communication with control unit 29, and a may further comprise a memory 205, e.g., memory 27 connected to processor 25. The memory 205, which is connected to processor 201, may comprise a number of memory components like a hard disk 211, Read Only Memory (ROM) 212, Electrically Erasable Programmable Read Only Memory (EEPROM) 213 en Random Access Memory (RAM) 214. Not all aforementioned memory components need to be present. Furthermore, it is not essential that aforementioned memory components are physically in close proximity to the processor 201 or to each other. They may be located at a distance away The processor 201 may also be connected to some kind of user interface, for instance a keyboard 215 or a mouse 216. A touch screen, track ball, speech converter or other interfaces that are known to persons skilled in the art may also be used.

The processor 201 may be connected to a reading unit 217, which is arranged to read data, e.g., in the form of computer executable code, from and under some circumstances store data on a computer readable medium, like a floppy disc 218 or a CDROM 219. Also DVD's or other computer readable media known to persons skilled in the art may be used.

The processor 201 may also be connected to a printer 220 to print out output data on paper as well as to a display 221, for example a monitor or LCD (Liquid Crystal Display), of any other type of display known to a person skilled in the art.

The processor 201 may be connected to a communications network 222, for instance a public switched telephone network (PSTN), a local area network (LAN), a wide area network (WAN) etc. by means of transmitters/receivers responsible for input/output (I/O) 223. The processor 201 may be arranged to communicate with other communication systems via the communications network 222. In an embodiment of the invention external computers (not shown), for instance personal computers of operators, can log into the processor 201 via the communications network 222.

The processor 201 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 201 may even be located a distance away of the other processing units and communicate via communications network 222.

In another embodiment the position of the burls is determined using actual height measurement data of a wafer W loaded on a substrate support 13. The lithographic apparatus according to FIG. 3 can perform a height measurement using a known technique of a Wafer W loaded on the support. According to this embodiment a height measurement is performed for at least one line of points on the wafer surface. Preferably a straight line of points is used, in particular in relation to an overlay measurement, which will be further described hereunder. In a further preferred embodiment a straight line of measurement points is used parallel with the X- and/or Y-direction of the lithographic apparatus. The X- and Y-directions are parallel to the long-stroke 33 and short stroke 31 stage modules according to FIG. 3. In another embodiment an arc of positions is chosen for measuring height data. The arc is preferably parallel with the position of the burls. Since the burls are preferably positioned circumferential around a centre, the arc preferably follows this circle. While a straight line or arc of burls is the more logical choice for this method, it should be appreciated that any connected string of burls may be used.

FIG. 10 shows an example of measurement data (simulated in this case) for several measurement points or markers (x-axis) and the relative height of the wafer at these markers. Here x is an indication for a row of marks along an x-axis.

Generally the burls are equally spaced in many parts of a wafer table design. These equally spaced burls will result in a periodically signal in the height data. In an embodiment of the invention a discrete Fourier transform is used to allow obtaining the phase of the periodical signal. This phase can then be used to determine the position of the table. Determining the position of the table will result in being able to calibrate the position of the table during subsequent loadings of wafers.

FIG. 11 shows typical results after Fourier transform of measurement data similar to that shown in FIG. 10 (although in this case the actual data transformed is different). Much of the noise is eliminated and a sharp peak remains, which is used to determine the phase of the signal. This phase is then used to determine the position of the burls and the position of the table.

In FIG. 11 a frequency maximum of 400 is detected, corresponding with a burl frequency of about 2.5 mm.

In an embodiment the calibration measurement of the wafer positioned on the wafer table is performed using a more flexible wafer than normal. In a preferred measurement the more flexible wafer in combination with the height measurement. The increased flexibility of the wafer will increase the signal/noise ratio.

In a further embodiment the periodic signal similar to FIG. 10 is determined by performing overlay measurements. In this embodiment a wafer is used with a number of lines with (densely) equally spaced markers. In this embodiment the wafer is loaded onto the substrate support and markers are measured that are in a line in a first direction, preferably a X-direction. Then the wafer is reloaded positioned with a shift in a first direction, preferably X-direction. The shift is preferably equal to half the spacing between burls as this gives the best signal to noise ratio (the approximate spacing between burls is known already as the spacing does not vary more than by 5% between burls). Subsequent the marks are measured again. The difference in positions creates a periodical signal. For Y a similar measurement is done but now with a shift in Y direction.

In an embodiment the bending of the wafer is influenced. The bending can be reduced by lowering the clamping pressure. Such an action can be used instead of repositioning during overlay measurements.

The overlay measurements will have a periodic signal. In the embodiment using repositioning, the signal will show a periodic displacement. Such first and second measurements are simulated and the respective data are shown in FIG. 12. Line 300 is a simulated bending at a first position and line 301 is a simulated bending with the wafer at a second position. In this example the shift in position is about equal to 0.3 the burl distance.

Using a frequency analysis, such as a discrete Fourier transform, will allow the determination of the burl frequency (more accurately than the approximate frequency/spacing used in determining the overlay shift), similar to determining the burl frequency in the height data. Frequency analysis has a good signal/noise ratio. The burl position can be obtained from overlay signal 302 which is the difference between the data 300 and 301. The position of the burls can be obtained from the overlay signal 302 in a number of ways, depending on the signs and direction of shift between the first and second position, using the maximum and minimum values of the difference signal. For the example shown, the height maxima of the burls (that is of plots 300 and 301) are located near the maxima of overlay signal 302 but at half the shift used (that is the shift between line 300 & 301) either side, moving back for the first measurement and moving forward for the second measurement. Therefore, as the shift in position is about 0.3 times the burl distance, the burl maxima can be found 0.15 times the burl distance on either side of the overlay signal 302 maxima.

Surprisingly it was found that the bending of the wafer between the burls shows similarities with a fourth order polynomial. Such a function can be described using harmonic functions, possibly a combination of harmonic functions. Discrete Fourier transform is a possible tool in determining the frequency of the main harmonic function describing the bending of the wafer and additionally the position of the burls.

The above technique of directly measuring the deflection of a wafer caused by the burls using height measurement data can be difficult in that the deflections to be measured are very small and therefore accurate measurement is difficult and requires complex calculation. Consequently a variation on this method is disclosed in which wafer table related features are made to appear, or at least appear more prominently, in the height related data. This dispenses with the need for the frequency analysis techniques mentioned above and therefore requires no major software modification. Furthermore, no hardware modification is required, which ensures that this method is inexpensive to implement.

The basic method is that, instead of directly measuring deflections from a large number of burls, it is simpler to measure relatively few, more prominent, wafer table related features. As only position and orientation of the wafer table needs to be determined, technically only the positions of two features are required, provided that they are known accurately. From these positions the position and orientation of the wafer table can be determined with respect to the measurement coordinate system. Consequently the burls on the wafer table can simply be located, these having a fixed pattern and position on the wafer table.

FIGS. 13, 14, 15, 16a, 16b, and 17 shows various configurations of a wafer table, according to various embodiments of the present invention.

Figure 13:
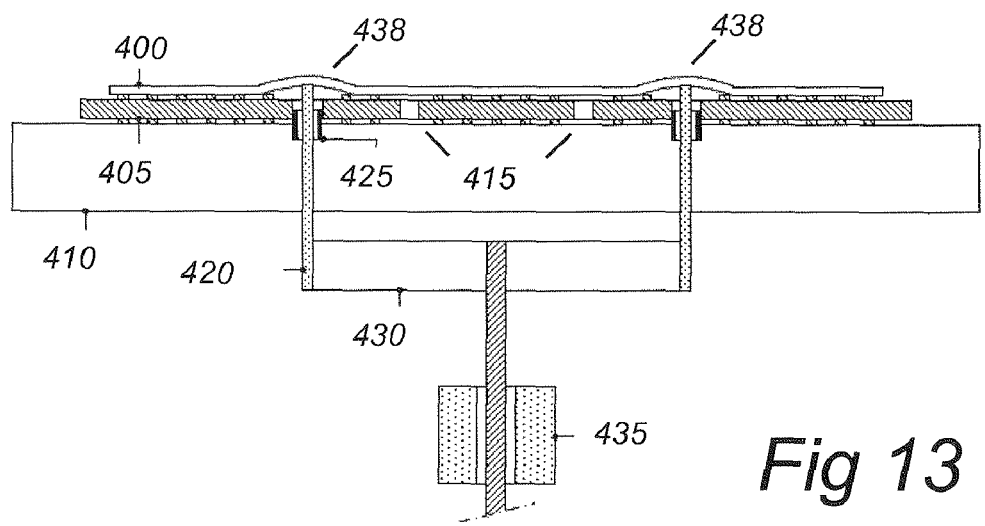

FIG. 13 shows an example of one such method. This shows wafer 400 on wafer table 405, which in turn is on a mirror block 410. Also shown are vacuum holes 415, E-pins 420, and their associated mechanism which include E-pin bushes 425, leaf springs 430 and E-pin motor 435. E-pins 420 and their intended purpose have been described above, with reference to FIG. 3. As stated there, there are normally three or more such E-pins 420 provided.

In this case the E-pins 420 are used to make deflections 438 in the wafer 400 that are much larger than those made by the burls. As a consequence these will show up prominently in the height measurement data. Assuming there is three or more E-pins 420 provided, then a corresponding number of locations on the wafer table can be accurately determined.

Figure 14:
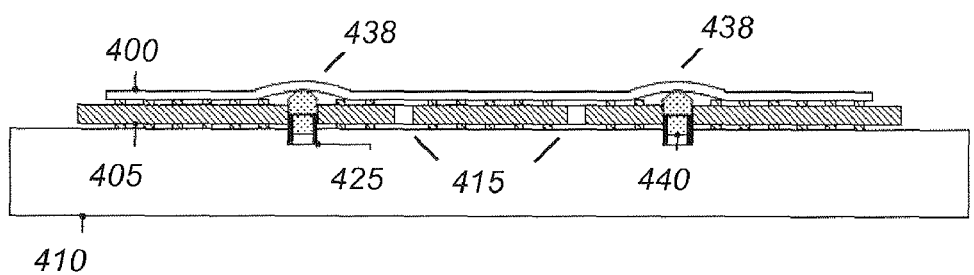

FIG. 14 shows a variation on the above method whereby calibration pins 440 are placed in the E-pin bushes 425. It is these calibration pins that make the prominent deflections 438 in the wafer 400.

Figure 15:
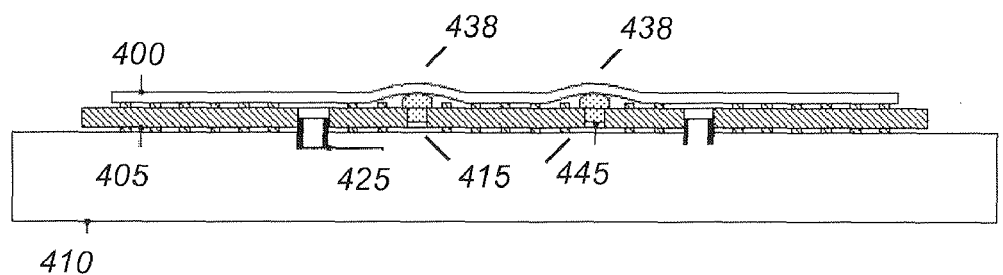

FIG. 15 shows another variation, similar to that of FIG. 14 whereby calibration pins 445, are placed in some of the vacuum holes 415, instead of in the E-pin bushes.

Figure 16A:
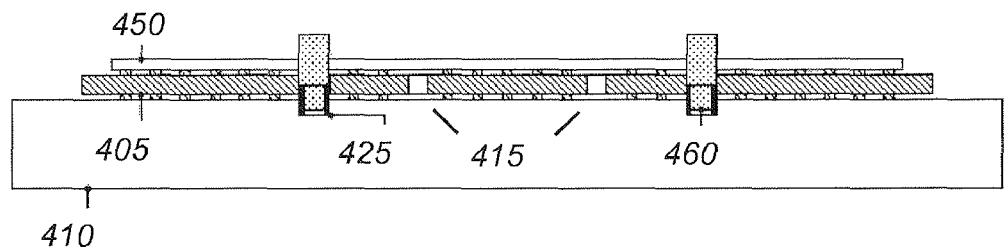
Figure 16B:
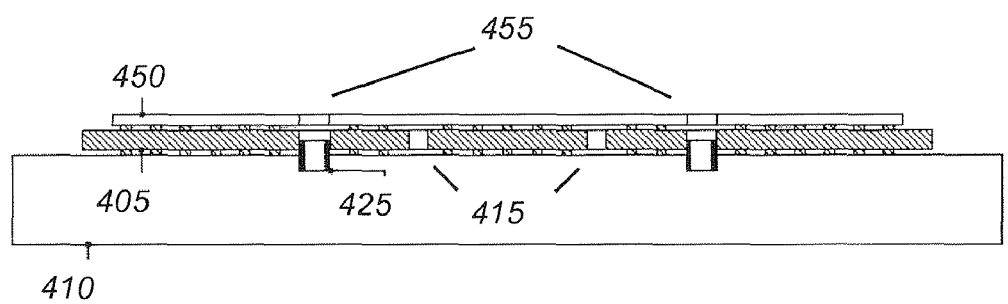

FIGS. 16a and 16b show a further variation on this method whereby a special calibration wafer 450 is used. This is provided with holes 455 which correspond with holes in the wafer table 405 surface, in this case the holes designed for the E-pins (although other holes, such as vacuum holes could be used. As seen in FIG. 16a, calibration pins 460 are placed in the E-pin bushes 425 such that the calibration wafer can be properly positioned with the holes 455 aligned with the holes in the wafer table 405. The pins 460 can then be removed (FIG. 16b), and the position of the holes 455 in the wafer 450 can now be determined on the height measurement data, these positions corresponding with the position of the E-pin holes on the wafer table 405.

Figure 17:
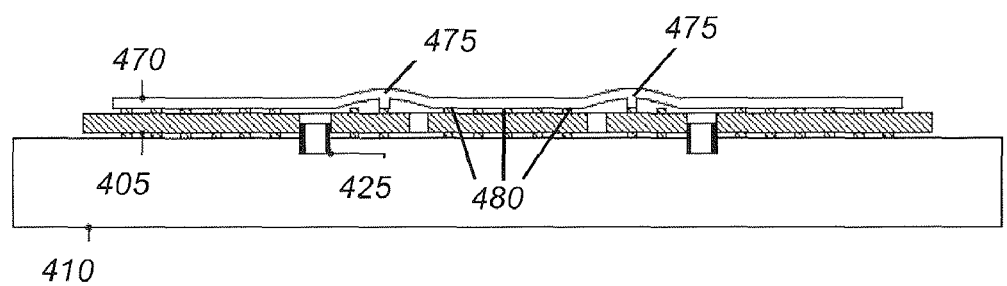

FIG. 17 shows a further variation using another special calibration wafer 470, having burls 475 on its underside. These burls 475 result in a significant and measurable deflection in the wafer 470 where they coincide with burls 480 on the wafer table 405. This has the desirable feature that the wafer table features that are being made more prominent are the burls 480 themselves (which are the features that ultimately require location), thus increasing accuracy. As the burls are made so prominent, much fewer locations are required compared to the direct measurement example. In fact, only two are sufficient, although in practice more accurate results can be obtained with ten to thirty burls, or a similar order of magnitude.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" and "target portion", respectively. The substrate referred to herein may be processed before or after exposure, in for example a track (a tool that typically applies a layer of resist to a substrate and develops the exposed resist), a metrology tool and/or an inspection tool. where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A method of placing a substrate onto a surface of a substrate holder, the surface being provided with a plurality of burls, the method comprising:
   acquiring a position of the plurality of burls;
   determining substrate placement data for placement of the substrate at a certain position with respect to a position of the plurality of burls on the surface of the substrate holder; and
   placing the substrate at the certain position in accordance with the substrate placement data,
   wherein the acquiring the position of the plurality of burls includes obtaining periodical data relating to the position of the burls, and wherein the periodical data is obtained by performing a measurement at each point for at least one arc of points on the substrate surface, by performing a measurement at each point for at least one straight line of points on the substrate surface, or by using height related data of the substrate on the substrate holder.

2. A method of placing a substrate onto a surface of a substrate holder, the surface being provided with a plurality of burls, the method comprising:
   acquiring a position of the plurality of burls;
   determining substrate placement data for placement of the substrate at a certain position with respect to a position of the plurality of burls on the surface of the substrate holder; and
   placing the substrate at the certain position in accordance with the substrate placement data,
   wherein the acquiring the position of the plurality of burls includes obtaining periodical data relating to the position of the burls, and wherein the periodical data is obtained using data from at least two partially overlaid measurements of the substrate on the substrate holder.

3. The method according to claim 2, wherein the bending of the substrate is influenced differently between measurements.

4. The method according to claim 2, wherein the substrate is shifted between measurements from a first position to a second position.

5. The method according to claim 4, wherein the first position and the second position are separated by approximately half a spacing between burls.

6. The method according to claim 2, wherein the position of the burls is obtained using an intermediate signal, two sets of periodical data being used to produce the intermediate signal, this intermediate signal being a difference between each set of the periodical data.

7. A method of placing a substrate onto a surface of a substrate holder, the surface being provided with a plurality of burls, the method comprising:

acquiring a position of the plurality of burls;

determining substrate placement data for placement of the substrate at a certain position with respect to a position of the plurality of burls on the surface of the substrate holder; and placing the substrate at the certain position in accordance with the substrate placement data, wherein the acquiring the position of the plurality of burls includes obtaining periodical data relating to the position of the burls, and wherein the acquiring a position of the plurality of burls is performed using height related data of the substrate on the substrate holder and at least two features of the substrate table are made to appear more predominantly in the height related data.

8. The method according to claim 7, wherein the height related data is used to calculate a position and angle of rotation of the substrate table with respect to a measurement co-ordinate system and therefore to determine of the position of the burls on the substrate table.

9. The method according to claim 7, wherein making the at least two features of the substrate table appear more predominantly in the height related data includes:

deforming the substrate by using different vacuum pressures, a thinner substrate, or a different substrate material to that normally used so as to increase a deformation of the substrate.

10. The method according to claim 9, wherein the at least two features comprise at least two burls, the at least two burls being made more predominant in the height related data by using a substrate itself comprising at least two burls on its underside such that the substrate deforms more significantly where a burl on the substrate table coincides with a burl on the substrate underside.

11. The method according to claim 10, wherein 10 to 30 of the burls are directly located in this manner, the rest of the buns located in relation to these.

12. The method according to claim 7, wherein the features of the substrate table comprise apertures, the burls being located in relation to the apertures.

13. The method according to claim 12, wherein the apertures are provided for producing a vacuum for clamping the substrate to the substrate table.

14. The method according to claim 12, wherein the apertures are provided for passing therethrough of E-pins.

15. The method according to claim 14, wherein the E-pins are deployed such that they protrude from the substrate table surface, so as to locally deform the substrate in such a way that the location of the apertures are determined from the height related data.

16. The method according to claim 12, wherein items are introduced into the apertures, the items locally deforming the substrate such that the location of the apertures are determined from the height related data.

17. The method according to claim 7, wherein the features of the substrate table comprise apertures, the burls then being located in relation to the apertures and items are introduced into the apertures that are then used to locate a substrate, the substrate itself having corresponding apertures, such that, when the items are removed, the location of the apertures are determined from the height related data.

18. A support system for supporting a substrate, the support system comprising:

a substrate holder configured to hold the substrate, the substrate holder comprising a surface provided with a plurality of burls;

a substrate handling device configured to place the substrate on the substrate holder in accordance with substrate placement data;

a measurement unit configured to perform measurement useable for determining a position of the plurality of burls provided on the surface of the substrate holder;

a processor configured to determine substrate placement data, the substrate placement data allowing placement of the substrate on the surface of the substrate holder at a certain position with respect to the position of the plurality of burls;

wherein the measurement unit is configured to obtain periodical data relating to the position of the burls, and wherein the measurement unit is configured such that a measurement is performed at each point for at least one straight line of points on the substrate surface.

19. A support system for supporting a substrate, the support system comprising:

a substrate holder configured to hold the substrate, the substrate holder comprising a surface provided with a plurality of burls;

a substrate handling device configured to place the substrate on the substrate holder in accordance with substrate placement data;

a measurement unit configured to perform measurement useable for determining a position of the plurality of burls provided on the surface of the substrate holder;

a processor configured to determine substrate placement data, the substrate placement data allowing placement of the substrate on the surface of the substrate holder at a certain position with respect to the position of the plurality of burls;

wherein the measurement unit is configured to obtain periodical data relating to the position of the burls, wherein the processor is further configured to determine the position of the burls on the substrate table by obtaining a phase of the periodical data, and wherein the measurement unit is configured such that the periodical data is obtained using height related data of the substrate on the substrate holder.

20. The support system according to claim 19, wherein:

the measurement unit is configured to obtain periodical data relating to the position of the burls, and the support system is arranged such that at least two features of the substrate table are made to appear more predominantly in the height related data.

21. The support system according to claim 20, wherein the measurement unit is configured such that the height related data is used to calculate the position and angle of rotation of the substrate table with respect to the measurement co-ordinate system and therefore to enable determination of the position of the burls on the substrate table.

22. The support system according to claim 20, wherein the measurement unit is configured such that at least two of the burls are made more predominant in the height related data by using a substrate itself comprising at least two burls on its underside such that the substrate deforms more significantly where a burl on the substrate table coincides with a burl on the substrate underside.

23. The support system according to claim 22, wherein the measurement unit is configured such that 10 to 30 of the burls are directly located in this manner, the rest of the burls located in relation to these.

24. The support system of claim 20, wherein the features of the substrate table comprise apertures, the measurement unit being configured such that the burls are located in relation to the apertures.

25. The support system of claim 24, such that E-pins are deployed such that they project from the substrate table surface, so as to locally deform the substrate such that the location of the apertures are determined from the height related data.

26. A support system for supporting a substrate, the support system comprising:
- a substrate holder configured to hold the substrate, the substrate holder comprising a surface provided with a plurality of burls;
- a substrate handling device configured to place the substrate on the substrate holder in accordance with substrate placement data;
- a measurement unit configured to perform measurement useable for determining a position of the plurality of burls provided on the surface of the substrate holder;
- a processor configured to determine substrate placement data, the substrate placement data allowing placement of the substrate on the surface of the substrate holder at a certain position with respect to the position of the plurality of burls;

wherein the measurement unit is configured to obtain periodical data relating to the position of the burls, wherein the processor is further configured to determine the position of the burls on the substrate table by obtaining a phase of the periodical data, and wherein the measurement unit is configured such that the periodical data is obtained using data from at least two partially overlaid measurements of the substrate on the substrate holder.

27. The support system according to claim 26, wherein the measurement unit is configured such that the substrate is shifted between measurements from a first position to a second position.

28. The support system according to claim 27, wherein the measurement unit is configured such that the first position and the second position are separated by approximately half a spacing between burls.

29. The support system according to claim 26, wherein the processor is configured such that the position of the burls is obtained using an intermediate signal, two sets of periodical data being used to produce the intermediate signal, this intermediate signal being the difference between each set of the periodical data.

\* \* \* \* \*

UNITED STATES PATENT AND TRADEMARK OFFICE
CERTIFICATE OF CORRECTION

| | | |
|---|---|---|
| PATENT NO. | : 8,154,709 B2 | Page 1 of 1 |
| APPLICATION NO. | : 12/784763 | |
| DATED | : April 10, 2012 | |
| INVENTOR(S) | : Alberti et al. | |

It is certified that error appears in the above-identified patent and that said Letters Patent is hereby corrected as shown below:

In column 19, claim 11, line 41, please delete "buns" and insert --burls--.

Signed and Sealed this
Twenty-sixth Day of June, 2012

David J. Kappos
*Director of the United States Patent and Trademark Office*